US010044143B2

(12) United States Patent
Jang et al.

(10) Patent No.: US 10,044,143 B2
(45) Date of Patent: Aug. 7, 2018

(54) MULTI-FUNCTIONAL POSITION HOLDER AND CONNECTOR INCLUDING SAME

(71) Applicant: SEJONG IND. CO., LTD., Ulsan (KR)

(72) Inventors: Seok-Yun Jang, Yongin-si (KR); Ho-Cheol Suh, Yongin-si (KR); Bong-Ki Kim, Yongin-si (KR)

(73) Assignee: SEJONG IND. CO., LTD., Ulsan (KR)

( * ) Notice: Subject to any disclaimer, the term of this patent is extended or adjusted under 35 U.S.C. 154(b) by 0 days.

(21) Appl. No.: 15/518,234

(22) PCT Filed: Oct. 14, 2015

(86) PCT No.: PCT/KR2015/010869
§ 371 (c)(1),
(2) Date: Apr. 10, 2017

(87) PCT Pub. No.: WO2016/068524
PCT Pub. Date: May 6, 2016

(65) Prior Publication Data

US 2017/0331227 A1 Nov. 16, 2017

(30) Foreign Application Priority Data

Oct. 28, 2014 (KR) ........................ 10-2014-0147249

(51) Int. Cl.
*H05K 1/00* (2006.01)
*H01R 13/6466* (2011.01)
(Continued)

(52) U.S. Cl.
CPC ......... *H01R 13/6466* (2013.01); *H01R 12/58* (2013.01); *H01R 13/15* (2013.01)

(58) Field of Classification Search
CPC ........ H01R 12/58; H01R 12/51; H01R 12/70; H01R 13/15; H01R 13/6466
(Continued)

(56) References Cited

U.S. PATENT DOCUMENTS 6,683,654 B1 * 1/2004 Haijima ............... H04N 5/2252 348/335
6,978,681 B2 * 12/2005 Sasaki ................. G01L 19/0645 73/756
(Continued)

FOREIGN PATENT DOCUMENTS

EP 1098183 A2 5/2001
EP 1219941 A2 7/2002
(Continued)

OTHER PUBLICATIONS

European Search Report in European Patent Application No. 15854056.7 dated Sep. 7, 2017, 8 pages.

*Primary Examiner* — Michael A Lyons
*Assistant Examiner* — Milagros Jeancharles
(74) *Attorney, Agent, or Firm* — TraskBritt

(57) ABSTRACT

A single multi-functional position holder is positioned in a receiving space of a housing to implement multiple functions of: satisfying a limitation on the height of a connector by making contact with an insertion portion and a concentric mounting portion of a connector assembly assembled through a curling process; increasing durability to absorb an internal load attributable to the curling process, by making tight contact with the housing; and preventing shaking of a PCB assembly due to a disturbance by restricting the PCB assembly to hold a PCB, thereby reducing the number of component parts of the connector, the process steps, and the cost. In particular, the multi-functional position holder is fixed in the housing without welding so that it is possible to remove a welding process from an assembling process of the connector.

8 Claims, 3 Drawing Sheets

(51) Int. Cl.
*H01R 12/58* (2011.01)
*H01R 13/15* (2006.01)

(58) Field of Classification Search
USPC ...................... 439/676, 76.1, 620.21, 620.22
See application file for complete search history.

(56) References Cited

U.S. PATENT DOCUMENTS 7,109,469 B2 * 9/2006 Hayashi ................. H01H 25/06 200/564
8,231,254 B2 * 7/2012 Beck ......................... F21K 9/00 362/372
8,246,203 B2 * 8/2012 Hancock ................... F21K 9/00 362/249.02
8,254,046 B2 * 8/2012 Lim ....................... G02B 7/026 359/822
9,124,022 B2 * 9/2015 Adachi ................ H01R 35/025
9,475,199 B2 * 10/2016 Burridge .................. B25J 17/00
9,719,875 B2 * 8/2017 Petrucelli .............. G01L 9/0055
2007/0210672 A1 * 9/2007 Fleminger ............ H01R 39/385 310/239
2008/0019685 A1 * 1/2008 Ishizuka ................ G02B 7/021 396/349
2012/0287630 A1 * 11/2012 Ou .......................... F21V 5/007 362/235
2013/0031984 A1 * 2/2013 Jones .................... G01L 19/143 73/717
2013/0142504 A1 * 6/2013 Warren .................. G03B 17/02 396/541

FOREIGN PATENT DOCUMENTS

FR 2791430 A1 9/2000
JP 05-032814 U 4/1993
KR 10-1998-0006642 A 7/1996
KR 2003-0042211 A 5/2003
KR 10-0813211 B1 3/2008
KR 2011-0076539 A 7/2011
KR 10-1436983 B1 9/2014

* cited by examiner

REGULATION OF CONNECTOR HEIGHT

ALLEVIATION OF CURLING LOAD

PCB HOLDING

MULTI-FUNCTIONAL POSITION HOLDER AND CONNECTOR INCLUDING SAME

CROSS-REFERENCE TO RELATED APPLICATIONS

This application is a national phase entry under 35 U.S.C. § 371 of International Patent Application PCT/KR2015/010869, filed Oct. 14, 2015, designating the United States of America and published as International Patent Publication WO 2016/068524 A2 on May 6, 2016, which claims the benefit under Article 8 of the Patent Cooperation Treaty to Korean Patent Application Serial No. 10-2014-0147249, filed Oct. 28, 2014, which is incorporated herein by reference in its entirety.

TECHNICAL FIELD

The present invention relates generally to a multi-functional position holder and, more particularly, to a multi-functional position holder satisfying requirements for an electrical connector without using additional component parts and to a connector including the same.

BACKGROUND

A typical electrical connector is a combination of an insulating housing in which a printed circuit board (PCB) assembly is accommodated and a connector assembly is provided with a conductive terminal. The insulating housing and the connector assembly are combined with each other through a curling process and are thus electrically connected to each other.

A connector is connected to a printed circuit board (PCB) constituting a control device for controlling various electronic devices, industrial machines, vehicles, fuel cell stacks, etc. Thus, an electrical signal can be input and output to and from the control device through the connector. A connector includes a plug (male-ended) and a jack (female-ended) that can be connected to each other.

Specifically, when a connector is assembled, it is required to hold a printed circuit board (PCB) assembly in place, regulate the height of a connector, and alleviate an internal load attributable to a curling process. To satisfy these requirements, a conventional connector is equipped with a PCB holder, a connector plate, and a rubber load-alleviating plate.

Specifically, during connector assembly, a PCB assembly has to be held in place, the height of a connector has to be regulated to a predetermined height, and a load of a connector assembly has to be alleviated during a curling process. To satisfy these requirements, a conventional connector is equipped with a PCB holder, a connector plate, and a rubber load-alleviating plate.

For example, the PCB holder holds a PCB assembly not to be displaced, and the connector plate regulates both the heights of the upper side and the lower side of a connector, thereby ensuring a connector satisfying standard specifications. In addition, the rubber load-alleviating plate prevents the internal structure of a PCB assembly from being damaged when an insulating housing and a connector assembly are combined with each other through a curling process. Thus, a connector with no contact failures is ensured.

BRIEF SUMMARY

Technical Problem

The PCB holder for holding a PCB assembly, the connector plate for regulating the height of a connector, and the load-alleviating plate for alleviating a load of a connector assembly serve only their own purpose and, thus, a conventional connector has to include all of these component parts. Thus, a connector consists of a large number of component parts, which increases the number of process steps and material costs when assembling a connector.

In addition, since the load-alleviating plate is typically combined with the insulating housing through welding, a process step is further added and, thus, cost is further increased.

Accordingly, this disclosure has been made keeping in mind the above problems occurring in the related art, and an object of this disclosure is to provide a multi-functional position holder having diverse functions, including: holding a printed circuit board (PCB) assembly in place; regulating the height of a connector; and alleviating an internal load during a curling process. That is, since the position holding, connector height regulation, and internal load alleviation are accomplished with the use of only a single multi-functional position holder, the number of component parts and the number of process steps required for production of a connector are reduced and, thus, the cost of a connector is reduced. In addition, the multi-functional position holder can be fixed to a housing without a welding process. That is, a further object of the disclosure is to provide a multi-functional position holder that does not require welding in an assembly process of a connector to which the multi-functional position holder is applied.

Technical Solution

In order to accomplish the above object, this disclosure provides a multi-functional position holder including: a ring body having an internal space; a holder protruding from an upper surface of a PCB mounting portion of the ring body and holding a component part inserted in the internal space; a height-regulating flange protruding from an upper surface of a periphery portion of the ring body and limiting a height of the component part inserted in the internal space; and a sleeve vertically standing on an upper surface of the height-regulating flange and supporting a load applied to the component part inserted in the internal space during a curling process.

The internal space of the ring body is provided with the PCB mounting portion, so that the internal space has a cross-section having an overall step shape. The holder has a height difference from the bottom surface of the internal space of the ring body, so that a gap is formed due to the height difference. The height-regulating flange includes a first height-determining flange, a second height-determining flange, a third height-determining flange, and a fourth height-regulating flange, each of which extends in a circumferential direction of the ring body by a predetermined length, and that are arranged at regular intervals on the upper surface of the ring body. The height of a connector is limited by the height of the upper surfaces of the first, second, third, and fourth height-determining flanges. The sleeve has an equilateral triangular cross-section and, thus, during a curling process, a load is applied to a top vertex of the equilateral triangular cross-section.

In order to accomplish the objects of this disclosure, a connector is provided including: a housing; a printed circuit board (PCB) assembly accommodated in a receiving space of the housing; a connector assembly accommodated in the receiving space of the housing and coupled to the PCB assembly through a curling process so that the connector assembly is electrically connected to the PCB assembly; and a multi-functional position holder that comes into contact with an insertion portion of the connector assembly to determine a height of the connector, coming into tight contact with an inner surface of the housing to alleviate a load applied during the curling process, thus improving durability of the connector and holding the PCB assembly to prevent the PCB assembly from being displaced or shaken by an external force or impact.

The inner surface of the receiving space of the housing is provided with a concentric contact portion with which the multi-functional holder comes into tight contact, thereby alleviating an internal load applied during the curling process and thus improving durability of the connector. The PCB assembly has a hole at the center thereof, and a protrusion protruding from a bottom surface of the receiving space of the housing is inserted through the hole of the PCB assembly when the PCB assembly is placed in the multi-functional holder. An outer circumferential surface of the insertion portion of the connector assembly is provided with a concentric mounting portion having a concentric circular frame shape. A height limitation requirement for the connector is satisfied when the concentric mounting portion is installed in the multi-functional position holder. The inner surface of the housing is provided with the concentric contact portion that protrudes inward from the inner surface of the housing and has a cross-section having an inverted triangle shape. The concentric contact portion comes into tight contact with the multi-functional position holder, a load of the connector assembly being applied to the concentric contact portion during the curling process.

Advantageous Effects

As described above, by using only one multi-functional position holder according to this disclosure, it is possible to implement three functions, i.e., holding a PCB's position, limiting the height of a connector, and alleviating an internal load during a curling process. Therefore, it is possible to dramatically reduce the number of component parts of a connector.

Since the multi-functional position holder of this disclosure reduces the number of internal component parts of a connector, the number of process steps and cost for a connector are reduced.

In addition, since the multi-functional position holder of this disclosure is fixed to the housing without welding, it is possible to remove a welding process from an assembling process of a connector. Thus, it is possible to avoid problems associated with welding.

DETAILED DESCRIPTION

Hereinafter, embodiments of this disclosure will be described with reference to the accompanying drawings. The disclosed embodiments can be diversely modified by those skilled in the art. Therefore, the embodiments of this disclosure are described only for illustrative purposes and should not be construed as limiting the present invention.

Figure 1:
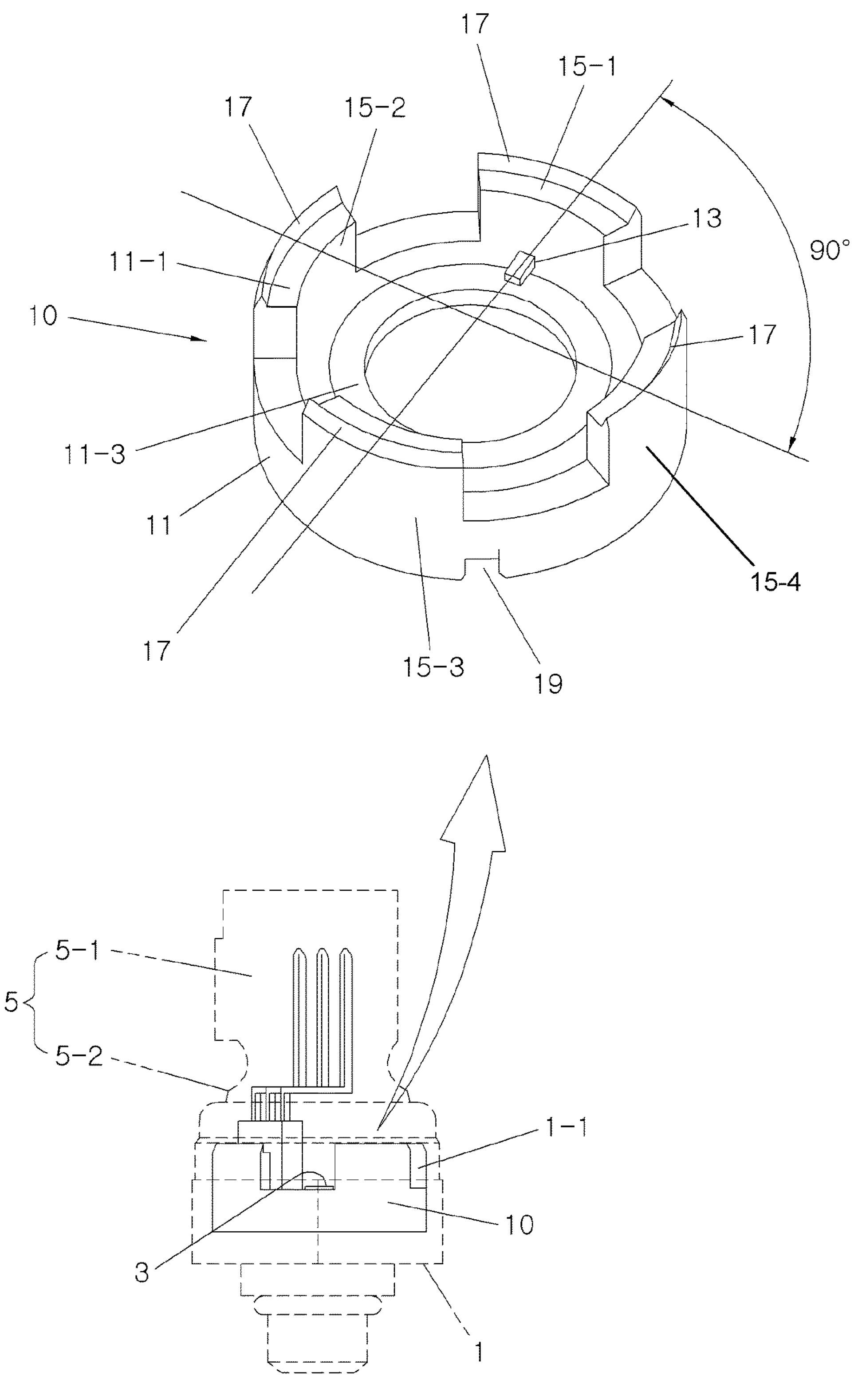
FIG. 1 is a diagram illustrating a connector provided with one multi-functional position holder according to one embodiment of the disclosure.
Figure 2:
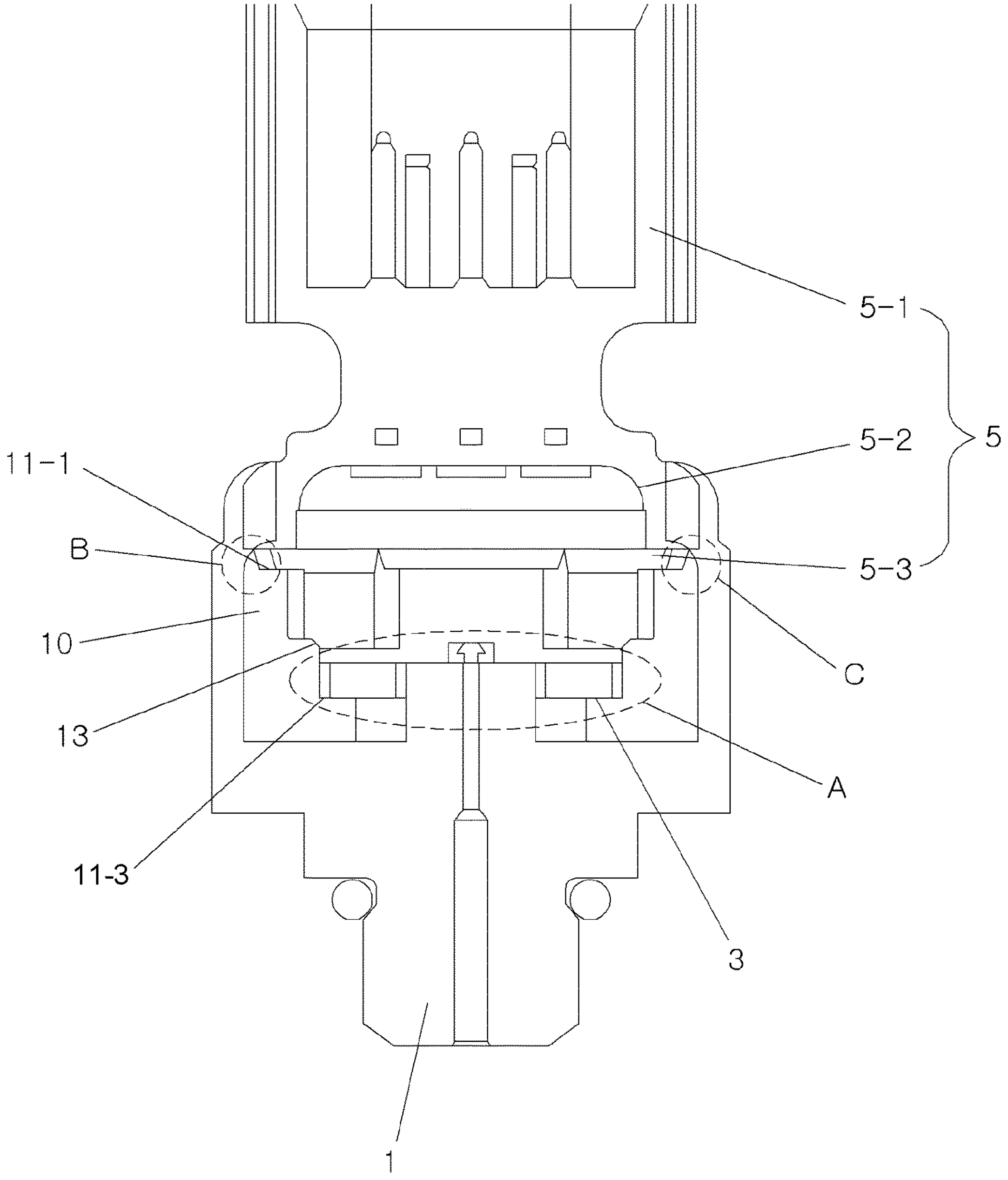
FIG. 2 is a cross-sectional view illustrating an assembled state of the connector having the multi-functional position holder.

FIG. 1 is a diagram illustrating the construction of a multi-functional position holder and the shape of a connector according to one embodiment of this disclosure, and FIG. 2 is a cross-sectional view illustrating the internal structure of the connector.

As illustrated, only one multi-functional position holder 10 is installed in a connector.

Specifically, the multi-functional position holder 10 includes: a circular ring body 11 having an internal space provided with a bottom surface and a central hole; a printed circuit board (PCB) holder 13 differing in height from the bottom surface of the internal space of the ring body 11 and protruding from an upper surface of a PCB mounting portion of the ring body 11; a first height-regulating flange 15-1, a second height-regulating flange 15-2, a third height-regulating flange 15-3, and a fourth height-regulating flange 15-4 that have a predetermined width, extend along a circumferential edge of the upper surface of the ring body 11, and stand at regular intervals; and sleeves 17 that vertically stand on upper surfaces of the first, second, third, and fourth height-regulating flanges 15-1, 15-2, 15-3, and 15-4, respectively, to which a load is applied during a curling process.

The internal space of the ring body 11 is provided with the PCB mounting portion 11-3. Thus, the internal space of the ring body 11 has a step-shaped cross-section. The PCB mounting portion 11-3 comes into surface contact with a PCB assembly 3, thereby stably maintaining the assembled state of the PCB assembly 3. The PCB holder 13 (FIG. 3) differs in height from the bottom surface of the ring body 11 and protrudes from the upper surface of the PCB mounting portion 11-3. The PCB holder 13 includes two PCB holders arranged to face each other near the first, second, third, and fourth height-regulating flanges 15-1, 15-2, 15-3, and 15-4.

The upper surfaces of the first, second, third, and fourth height-regulating flanges 15-1, 15-2, 15-3, and 15-4 serve as connector assembly installation surfaces 11-1 on which concentric mounting portions 5-3 of the connector assembly 5 are placed. The sleeves 17 are provided on outer periphery portions of the upper surfaces of the first, second, third, and fourth height-regulating flanges 15-1, 15-2, 15-3, and 15-4, respectively, and have an equilateral triangular cross-section in which two vertexes of the triangular cross-section are on the upper surface of the corresponding height-regulating flange and the remaining vertex of the triangular cross-section is above the upper surface of the corresponding height-determining flange.

In addition, the multi-functional position holder 10 is further provided with a positioning recess 19 at a lower end of the ring body 11. The positioning recess 19 of the multi-functional position holder 10 is engaged with a protrusion formed in a receiving space 1-1 of a housing 1. In this way, the housing 1 and the multi-functional position holder 10 can be easily and simply assembled with each other.

On the other hand, a connector includes: the housing 1 in which the multi-functional position holder 10 is accommodated; a printed circuit board (PCB) assembly 3 accommodated in the housing 1 and assembled with the multi-functional position holder 10 such that a printed circuit board (PCB) thereof is held not to be displaced; and a connector assembly 5 assembled with the housing 1 through a curling process during which the multi-functional position holder 10 limits the height of the connector and alleviates a load of the connector assembly 5 applied to the inside of the housing during the curling process.

Figure 3:
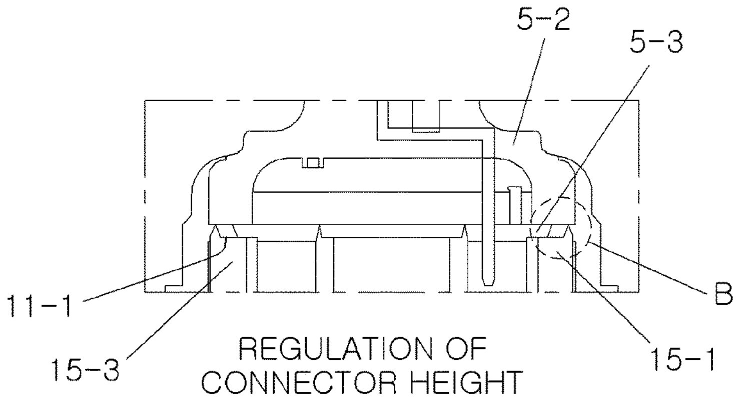
FIG. 3 is a diagram illustrating operation of the multi-functional position holder that holds a printed circuit board (PCB) assembly not to be displaced, limits the height of a connector, and alleviates an internal load applied during a curling process.
Figure 3:
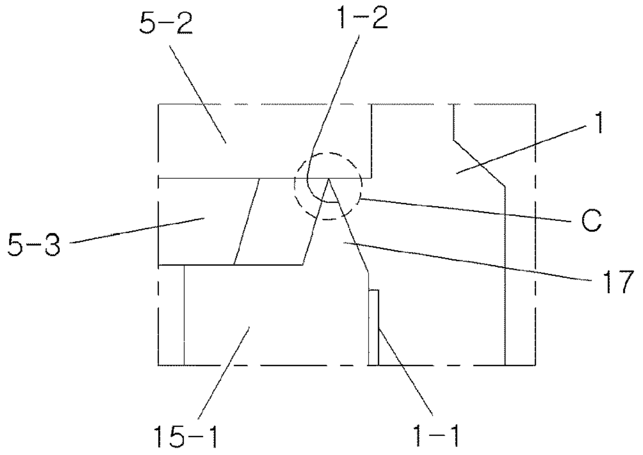
Figure 3:
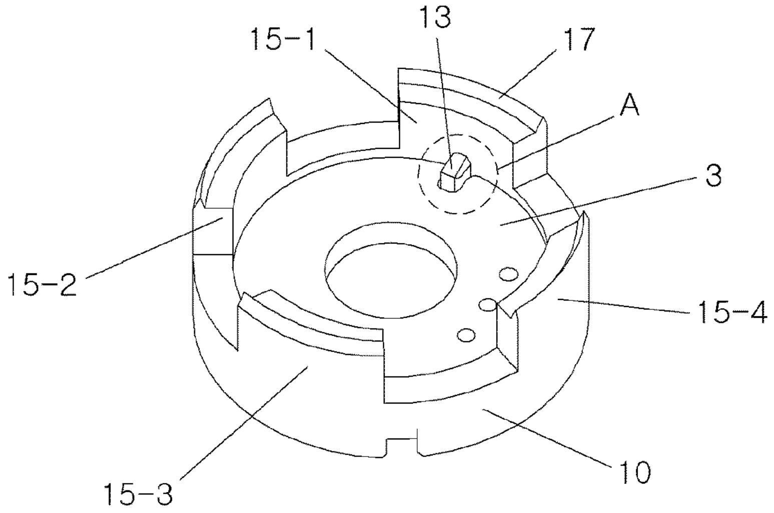

Specifically, the housing 1 has a coupling structure, which can be coupled to an external device, and the receiving space 1-1 in which the multi-functional position holder 10 and a portion of the connector assembly 5 can be accommodated. A portion of the inner surface of the receiving space 1-1 is provided with a concentric contact portion 1-2 (FIG. 3). The concentric contact portion 1-2 having an inverted triangle shape whose two vertexes are on the inner surface of the receiving space 1-1 and remaining vertex is spaced from the inner surface of the receiving space 1-1 so that an operator can visually check by a naked eye the concentric contact portion.

Specifically, the position of the PCB assembly 3 is held when the PCB holder 13 is combined with the multi-functional position holder 10. Therefore, the PCB assembly 3 is not displaced during the curling process. The PCB assembly 3 has a ring shape. That is, the PCB assembly 3 has a hole at the center thereof, and a central protrusion protruding from the bottom surface of the receiving space of the housing 1 is inserted through the hole of the PCB assembly 3 when the PCB assembly 3 is installed in the housing 1. In addition, the PCB assembly 3 is provided with an electronic element and a circuit pattern, thereby generating an electrical signal.

The connector assembly 5 is connected to a connector provided to a substrate, a sensor, or an electronic device, thereby serving as an input unit or an output unit through which an electrical signal or electric power is input or output. The connector assembly 5 may include a plurality of terminals used for electrical contact. The connector assembly 5 is roughly divided into a connection portion 5-1 that is exposed outside the housing 1 and an insertion portion 5-2 that is disposed in the housing 1. The insertion portion 5-2 is provided with a concentric mounting portion 5-3 that is a circular frame-shaped protrusion, which effectively limits the height of the connector assembly 5 with respect to the housing 1.

FIG. 3 illustrates how the multi-functional position holder 10 holds the position of the PCB assembly, limits the height of a connector, and alleviates an internal load during curing.

In a state in which the PCB assembly is held as indicated by a dotted line A, a pin-shaped upper portion of the PCB holder 13 restricts movement of the PCB assembly 3 placed on the PCB mounting portion 11-3 (FIG. 2) of the ring body 11, thereby preventing the PCB assembly 3 from being shaken and detached from the multi-functional PCB holder 10 by external force or impact.

In a state in which the height of a connector is limited as indicated by a dotted line B, when the concentric mounting portion 5-3 of the connector assembly 5 is placed on the connector assembly installation surface 11-1 of the ring body 11, the height of the connector assembly 5 is automatically determined without operator intervention.

In a load-alleviating state during curling as indicated by a dotted line C, the sleeves 17, on the first, second, third, and fourth height-regulating flanges 15-1, 15-2, 15-3, and 15-4, having an equilateral triangular cross-section are in tight contact with the concentric contact portion 1-2 that has an inverted triangular cross-section and protrudes inward from the inner surface of the receiving space 1-1 of the housing 1. This tight contact state alleviates the load of the connector assembly 5 by increasing an area to which the load is applied when the housing 1 and the connector assembly 5 undergo the curling process.

As described above, the multi-functional position holder 10, according to one embodiment of this disclosure, is received in the receiving space 1-1 of the housing 1 and, at this point, the insertion portion 5-2 of the connector assembly 5 that is assembled through a curling process comes into contact with the concentric mounting portion 5-3, thereby limiting the height of a connector. In addition, the multi-functional position holder comes into tight contact with the inner surface of the housing, thereby alleviating the internal load of the connector assembly during the curling process and improving durability of a connector. In addition, the multi-functional position holder restricts the movement of the PCB assembly 3, i.e., maintains the position of the PCB assembly 3, thereby preventing the PCB assembly from being shaken by external force or impact. That is, since these diverse functions are performed with the use of only one multi-functional position holder according to the embodiment of this disclosure, the number of component parts and the number of process steps to produce a connector are reduced and, thus, cost for a connector is reduced. Furthermore, since the multi-functional position holder 10 is fixed in the housing 1 without using welding, it is possible to eliminate a welding process when assembling a connector.

The invention claimed is:

1. A multi-functional position holder, comprising:
- a ring body with an internal space in which a PCB mounting portion is provided, the internal space having a step-shaped cross-section;
- a printed circuit board (PCB) holder protruding from an upper surface of the PCB mounting portion and holding a component part inserted in the internal space;
- a height-regulating flange protruding from an upper surface of a periphery portion of the ring body and limiting a height of the component part inserted into the internal space; and
- a sleeve vertically standing on an upper surface of the height-regulating flange and supporting a load applied to the component part inserted in the internal space during a curling process;
- wherein the sleeve has an equilateral triangular cross-section, and the load is applied to a top vertex of the equilateral triangular cross-section during the curling process.

2. The multi-functional position holder according to claim 1, wherein the PCB holder comprises two PCB holders installed to face each other, the PCB holder having a height difference from a bottom surface of the ring body, whereby a gap is formed afterward due to the height difference.

3. The multi-functional position holder according to claim 1, wherein the height-regulating flange includes a first height-regulating flange, a second height-regulating flange, a third height-regulating flange, and a fourth height-regulating flange, each of which extends in a circumferential direction of the ring body by a predetermined length and are arranged at regular intervals on the upper surface of the ring body.

4. The multi-functional position holder according to claim 3, wherein a height of a connector is limited by the upper surfaces of the first, second, third, and fourth height-regulating flanges.

5. A connector comprising:
- a housing;
- a printed circuit board (PCB) assembly accommodated in a receiving space of the housing;

a connector assembly located in the receiving space of the housing and coupled to the PCB assembly through a curling process to be electrically connected to the PCB assembly; and the multi-functional position holder according to claim 1;

wherein an inner surface of the receiving space of the housing is provided with a concentric contact portion with which the multi-functional position holder comes into tight contact, thereby alleviating an internal load during the curling process.

6. The connector according to claim 5, wherein the PCB assembly has a hole, at a center thereof, through which a protrusion protruding from a bottom surface of the receiving space of the housing is inserted when the PCB assembly is installed in the multi-functional position holder.

7. The connector according to claim 5, wherein an outer circumferential surface of an insertion portion of the connector assembly is provided with a concentric mounting portion, and a height of the connector is limited when the concentric mounting portion is installed in the multi-functional position holder.

8. The connector according to claim 5, wherein an inner surface of the housing is provided with a concentric contact portion that protrudes from the inner surface and has a cross-section having an inverted triangle shape, and the concentric contact portion is in tight contact with multi-functional position holder, thereby supporting a load of the connector assembly during the curling process.

* * * * *